US010410888B2

(12) United States Patent
Semmelrock et al.

(10) Patent No.: US 10,410,888 B2
(45) Date of Patent: Sep. 10, 2019

(54) DEVICE AND METHOD FOR REMOVING LIQUID FROM A SURFACE OF A DISC-LIKE ARTICLE

(71) Applicant: LAM RESEARCH AG, Villach (AT)

(72) Inventors: Christoph Semmelrock, Klagenfurt (AT); Dietmar Hammer, Treffen (AT)

(73) Assignee: LAM RESEARCH AG, Villach (AT)

( * ) Notice: Subject to any disclaimer, the term of this patent is extended or adjusted under 35 U.S.C. 154(b) by 1133 days.

(21) Appl. No.: 14/192,416

(22) Filed: Feb. 27, 2014

(65) Prior Publication Data
US 2015/0243533 A1 Aug. 27, 2015

(51) Int. Cl.
*H01L 21/67* (2006.01)

(52) U.S. Cl.
CPC .. *H01L 21/67034* (2013.01); *H01L 21/67028* (2013.01); *H01L 21/67051* (2013.01)

(58) Field of Classification Search
CPC ......... H01L 21/67028; H01L 21/67034; H01L 21/67051
USPC .......... 134/88, 94.1, 95.1, 95.2, 95.3, 103.2, 134/103.3, 157, 902
See application file for complete search history.

(56) References Cited

U.S. PATENT DOCUMENTS

| 5,882,433 A | 3/1999 | Ueno |
| 6,536,454 B2 | 3/2003 | Lindner |
| 2010/0206338 A1 | 8/2010 | Kraus et al. |
| 2011/0289795 A1* | 12/2011 | Ishibashi .......... H01L 21/02074 34/467 |

* cited by examiner

*Primary Examiner* — Levon J Shahinian (57) ABSTRACT

A device for removing liquid from a surface of a disc-like article comprises a spin chuck for holding and rotating a single disc-like article about an axis of rotation and a liquid dispenser for dispensing liquid onto the disc-like article. A first gas dispenser comprises at least one nozzle with at least one orifice for blowing gas onto the disc-like article, and a second gas dispenser comprises at least one nozzle with at least one orifice for blowing gas onto the disc-like article. A rotary arm moves the liquid dispenser and the second gas dispenser across the disc-like article so that the second gas dispenser and the liquid dispenser move to a point in a peripheral region of the spin chuck. The at least one nozzle of the second gas dispenser is elongated along a first horizontal line that defines an angle α of 5-20° relative to a second horizontal line connecting the center of the second gas dispenser and the rotation axis of the rotary arm.

15 Claims, 5 Drawing Sheets

DEVICE AND METHOD FOR REMOVING LIQUID FROM A SURFACE OF A DISC-LIKE ARTICLE

BACKGROUND OF THE INVENTION

1. Field of the Invention

The invention relates to a device for removing liquid from a surface of a disc-like article. More particularly the invention refers to a device for fluid treating a disc-like article to remove liquid from a surface.

2. Description of Related Art

Several liquid removing methods are known in semiconductor industry. Many liquid removing methods use a defined liquid/gas boundary layer. Such liquid removing methods are better known as Marangoni drying methods.

U.S. Pat. No. 5,882,433 discloses a combined Marangoni spin drying method and a device therefore. Thereby deionized water is dispensed onto a wafer and simultaneously a mixture of nitrogen with 2-propanol is dispensed. The 2-propanol in the nitrogen influences the liquid/gas boundary layer in that a surface gradient occurs, which leads to the effect that the water runs off the wafer without leaving any droplets on the wafer (Marangoni Effect). The gas dispenser directly follows the liquid dispenser while the liquid dispenser is moved from the center to the edge of the wafer and while the wafer is spun and thereby gas directly displaces the liquid from the wafer.

Commonly-owned copending application US 2010/0206338 describes an improved drying device in which a wetting nozzle is followed by two types of gas nozzles, namely, a central opening nozzle that supplies gas at a relatively higher velocity to open the liquid layer on the disc surface, and a pair of lateral curtain nozzles that supply gas at a relatively lower velocity to supply gas to a broader area of the boundary layer.

However, the present inventors discovered that when such a drying device is conventionally mounted on a swivel arm, rather than being mounted for linear movement, droplets of liquid can remain on the wafer surface after the gas nozzles have passed over the surface. Such remaining droplets may result in undesired marks on the wafer, which may be unacceptable.

SUMMARY OF THE INVENTION

Thus, in one aspect, the present invention relates to a device for removing liquid from a surface of a disc-like article, comprising a spin chuck for holding and rotating a single disc-like article about an axis of rotation and a liquid dispenser for dispensing liquid onto the disc-like article. A first gas dispenser comprises at least one nozzle with at least one orifice for blowing gas onto the disc-like article, and a second gas dispenser comprises at least one nozzle with at least one orifice for blowing gas onto the disc-like article. A rotary arm moves the liquid dispenser and the second gas dispenser across the disc-like article so that the second gas dispenser and the liquid dispenser move to a point in a peripheral region of the spin chuck. The at least one nozzle of the second gas dispenser is elongated along a first horizontal line that defines an angle $\alpha$ of 5-20° relative to a second horizontal line connecting the center of the second gas dispenser and the rotation axis of the rotary arm.

In a preferred embodiment a is in a range from /2−3° to /2+3°, wherein is defined as the angle of the movement of the rotary arm from the center of the disc-like article to the edge of the disc-like article.

In a preferred embodiment a direction of alignment of the liquid dispenser and the first gas dispenser is perpendicular to the line between the center of the second gas dispenser and the rotation axis of the rotary arm.

In preferred embodiments of the device according to the present invention, the liquid dispenser, the first gas dispenser and the second gas dispenser are integrated into a multi-nozzle head mounted at a distal end of the rotary arm.

In preferred embodiments of the device according to the present invention, a sum of cross-sectional areas of the orifice(s) of the first gas dispenser is smaller than a sum of cross-sectional areas of the orifice(s) of the second gas dispenser.

In preferred embodiments of the device according to the present invention, the liquid dispenser and the second gas dispenser are positioned on the rotary arm so that the second gas dispenser follows the liquid dispenser as the liquid dispenser and the second gas dispenser are moved across the disc-like article.

In preferred embodiments of the device according to the present invention, the liquid dispenser and the first gas dispenser are positioned on the rotary arm so that the first gas dispenser follows the liquid dispenser as the liquid dispenser and the first gas dispenser are moved across the disc-like article.

In preferred embodiments of the device according to the present invention, the at least one orifice of the second gas dispenser comprises is slit-shaped and elongated along the first horizontal line.

In preferred embodiments of the device according to the present invention, the at least one orifice of the second gas dispenser comprises two slit-shaped orifices, each of which is elongated along the first horizontal line.

In preferred embodiments of the device according to the present invention, the two slit-shaped orifices are aligned along the first horizontal line.

In preferred embodiments of the device according to the present invention, an outlet orifice of the liquid dispenser and the at least one orifice of the first gas dispenser are aligned along a third horizontal line that is essentially perpendicular to the second horizontal line.

In preferred embodiments of the device according to the present invention, the angle $\alpha$ is 8-15°, preferably 9-13° and more preferably 9-11°.

In preferred embodiments of the device according to the present invention, the at least one orifice of the second gas dispenser comprises two orifices, neither of which is elongated along the first horizontal line, the two orifices being aligned along the first horizontal line.

In preferred embodiments of the device according to the present invention, the rotary arm is configured to rotate about a vertical axis parallel to and offset from the axis of rotation of the spin chuck, so as to move the second gas dispenser along an arcuate path from the axis of rotation of the spin chuck to the point in the peripheral region of the chuck, and wherein the angle $\alpha$ is approximately half of an angle subtended by the arcuate path to the axis of rotation of the rotary arm.

In preferred embodiments of the device according to the present invention, the first horizontal line forms an angle with a radius of rotation of the spin chuck that changes continuously as the second gas dispenser is moved across the spin chuck.

In another aspect, the present invention relates to a method for removing liquid from a surface of a disc-like article, comprising:

rotating the disc-like article about an axis perpendicular to the disc-like article's main surface;

supplying liquid onto the disc-like article when rotated, wherein the liquid is supplied from a supply port, which is moved across the substrate along an arcuate path beginning at or before a center and extending to a point in an edge region of the disc-like article;

supplying a first gas flow through a first gas supply port onto the disc-like article; and supplying a second gas flow through a second gas supply port onto the disc-like article when rotated, wherein the second gas flow is supplied from a second gas supply port that is elongated along a first horizontal line, the first horizontal line defining an angle α of 5-20° with a second horizontal line connecting the center of the second gas dispenser and the rotation axis of the rotary arm.

In preferred embodiments of the method according to the present invention, the supplying of the second gas flow starts after the first gas flow has started.

In preferred embodiments of the method according to the present invention, the second gas flow is started when the outer edge of the second gas supply port is at a distance to the center of the rotational movement of at least 20 mm.

In preferred embodiments of the method according to the present invention, the gas velocity of the first gas flow is at least double of the gas velocity of the second gas flow.

In preferred embodiments of the method according to the present invention, the gas volume flow of the first gas flow is not more than half of the gas volume flow of the second gas flow.

In preferred embodiments of the method according to the present invention, the gas velocity v1 of the first gas flow is minimum 3 m/s.

In preferred embodiments of the method according to the present invention, a substance decreasing the surface tension of a removing liquid is applied either through the removing liquid or through at least the second gas flow or through both the removing liquid and at least the second gas flow.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
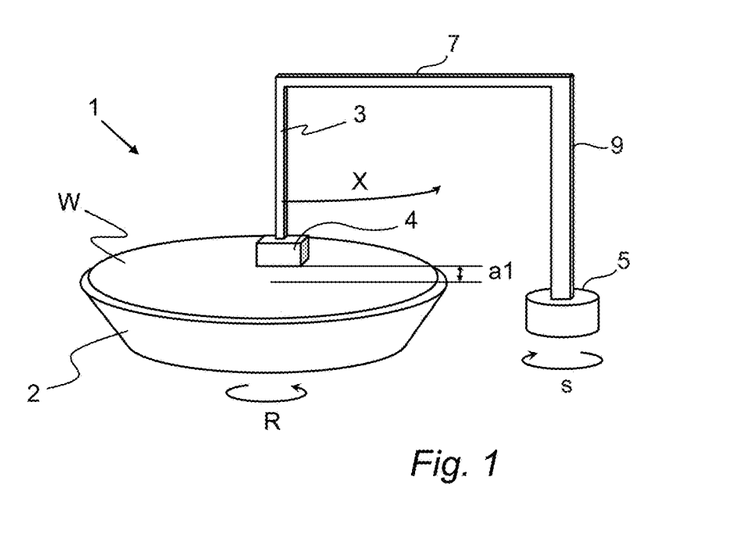
FIG. 1 is a schematic view of an embodiment of the invention.

FIG. 1 shows a device 1 for removing liquid from a surface of a disc-like article W according to a preferred embodiment. The device comprises a spin chuck 2 for holding the disc-like article W and a rotary arm 3, on which a nozzle assembly 4 is mounted. In this case the disc-like article is a semiconductor wafer. The spin chuck 2 can rotate (shown by arrow R). The nozzle assembly 4 comprises a plurality of nozzles with orifices facing downward. Different fluids are discharged through such nozzles towards the upward facing surface of the wafer.

The arm 3 and the nozzle assembly 4 are connected to a moving mechanism 5 to move the nozzle assembly 4 across the wafer's surface. The arm 3 comprises a horizontal boom 7 and a vertical upright 9 connected to the moving mechanism. The nozzle 4 is thereby guided in a path X that is a circular arc centered on the axis of rotation s of the moving mechanism 5.

While moving the nozzle assembly 4 across the wafer a nearly constant distance a1 is maintained between the nozzle assembly and the wafer surface. Such distance is optimized depending on the process parameters (e.g. fluid flows, chuck speed) and is selected between 1 mm and 5 cm, preferably between 3 mm and 2 cm. The distance of the nozzle assembly is hereby defined as being the distance of the nozzle orifice, which is closest to the wafer.

FIGS. 2-7 show schematic bottom views of six different embodiments for the nozzle assembly 4. It will be noted that these embodiments differ from those of the commonly-owned co-pending application US 2010/0206338 principally in the position and orientation of the curtain nozzles 6.

Figure 2:
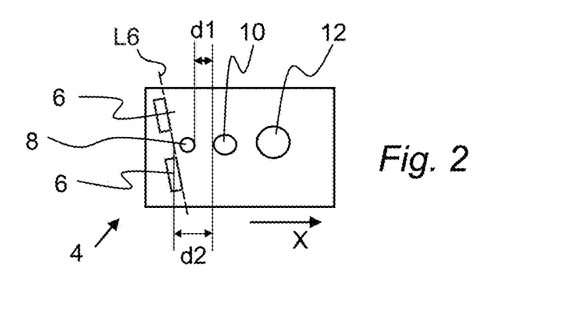
FIG. 2 is a schematic bottom view of a nozzle configuration in a first embodiment of the invention.

In FIG. 2, a wetting nozzle 10 supplies a wetting liquid during the liquid removing process, an opening nozzle 8 for a first gas flow blows gas onto a closed liquid layer (when the whole wafer surface is covered with liquid) and thereby opens the liquid layer of wetting liquid, and two curtain nozzles 6 for a second gas flow provide gas atmosphere. The nozzle assembly 4 optionally further comprises a rinsing nozzle 12 for dispensing rinsing liquid (e.g. DI-water) onto the wafer before the liquid removing process is started. This gives the advantage that there is no need of a separate medium arm.

The cross-sectional area of the orifice of opening nozzle 8 is preferably smaller than the sum of cross-sectional areas of the orifices of the curtain nozzles 6. In the present embodiment the cross sectional area of the opening nozzle's orifice is 8 mm$^2$ (diameter is 3.2 mm) whereas the sum of cross-sectional areas of the two orifices of the curtain nozzles' orifices is 32 mm$^2$ (2×2 mm×8 mm).

If the gas volume flow of the first gas (f1 through opening nozzle 8) and the gas volume flow of the second gas (f2 through curtain nozzles 6) is selected the same (e.g. f1=f2=6 l/min) the gas velocity (v1) of the gas dispensed through the opening nozzle is four times higher than the gas velocity (v2) of the gas dispensed through the curtain nozzle. Therefore the impulse directed toward the liquid layer through the opening nozzle is four times higher than the impulse generated by the curtain nozzles.

The distance d1 describes the distance between opening nozzle's orifice 8 and wetting nozzle's orifice 10.

The distance d2 describes the distance between the midpoint of a line L6 along the rear edge of curtain nozzle's orifices 6 and wetting nozzle's orifice 10. This distance d2 is hereby defined as being the distance between the midpoint of the straight line L6 and the contour of the wetting nozzle 10. The straight line L6 connects the contours of the orifices of the curtain nozzles. The straight line L6 touches the part of the contours of the orifices, which are facing the wetting nozzle 10. In the shown embodiment d1 is smaller than d2 (d2−d1=4 mm). The distances d1, d2 are not the center-to-center distances between the nozzles.

The second gas dispenser comprises two slit-shaped nozzles, wherein each slit is arranged at an angle α described more fully herein, whereby the second gas dispenser dispenses a gas curtain.

Figure 3:
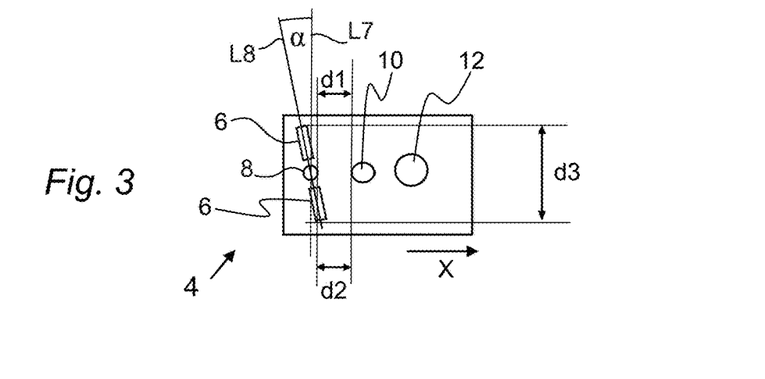
FIG. 3 is a schematic bottom view of a nozzle configuration in a second embodiment of the invention.

The second embodiment of the nozzle assembly 4 shown in FIG. 3 is based on the first embodiment (FIG. 2) however in this case the distances d1 and d2 are the same.

The angle α is designated in this embodiment, which is the angle formed by a horizontal line L7 that connects the rotation axis s of the rotary arm 3 to the center of the second gas dispenser, and the horizontal line L8 along which the curtain nozzles 6 extend. The center of the second gas nozzle is considered to be the midpoint of the curtain nozzle as measured vertically and horizontally from the vantage shown in FIG. 3, or, in the case of plural curtain nozzles 6, the midpoint of the area occupied by the nozzles 6. Thus, in FIG. 3, the center of the second gas nozzle is coincident with the center of nozzle 8.

Figure 4:
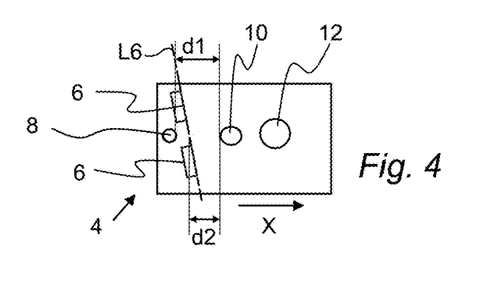
FIG. 4 is a schematic bottom view of a nozzle configuration in a third embodiment of the invention.

The third embodiment of the nozzle assembly shown 4 in FIG. 4 is based on the first embodiment (FIG. 2) however in this case the distance d1 is greater than the distance d2 (d1>d2; d2−d1=−4 mm).

Figure 5:
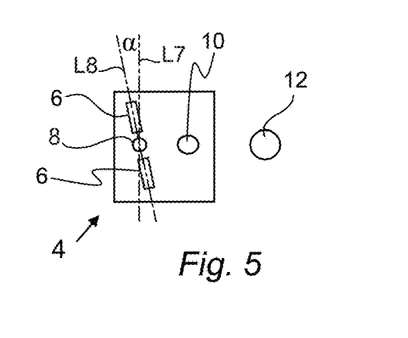
FIG. 5 is a schematic bottom view of a nozzle configuration in a fourth embodiment of the invention.

The fourth embodiment of the nozzle assembly 4 shown in FIG. 5 is based on the second embodiment (FIG. 3); however, the rinsing nozzle 12 is mounted on a separate arm. Although this leads to a mechanically more complicated solution this gives the advantage that the rinsing nozzle can be removed from the space above the wafer and thus the rinsing nozzle does not interfere with the liquid removing process.

If d2 is at least as big as d1 the distance d1 should be in the range of 0.5 cm to 3 cm. If d1 is at least as big as d2 the distance d2 should be in the range of 0.5 cm to 3 cm.

Figure 6:
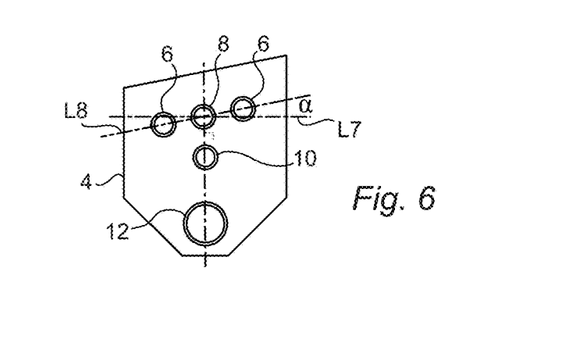
FIG. 6 is a schematic bottom view of a nozzle configuration in a fifth embodiment of the invention.

The embodiment of FIG. 6 shows that, when there are at least two curtain nozzles 6, the individual nozzles 6 need not be elongated; however, the plural nozzles 6 collectively are nonetheless considered to be "elongated" as that term is used herein, in that they extend along the line L8.

Figure 7:
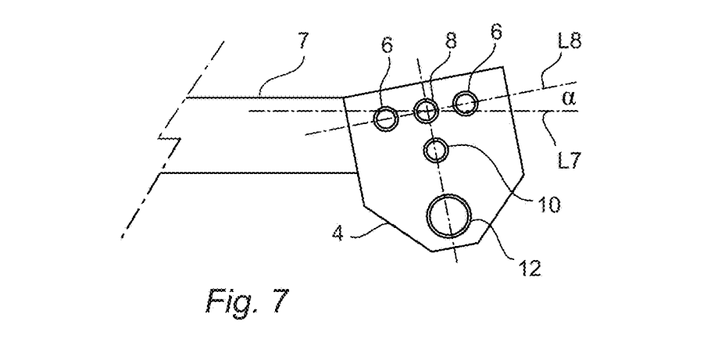
FIG. 7 is a schematic bottom view of a nozzle configuration in a sixth embodiment of the invention.
Figure 8:
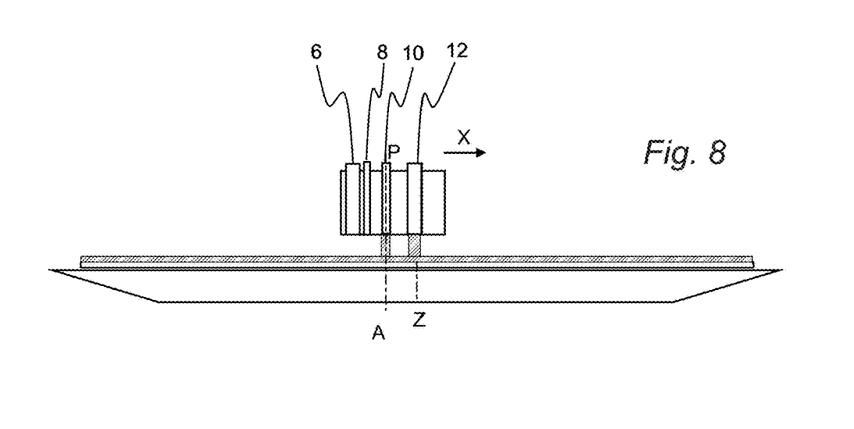
FIG. 8 is a schematic cross-sectional view of an embodiment of the invention before the nozzle starts the liquid removing in the center of a semiconductor wafer.
Figure 9:
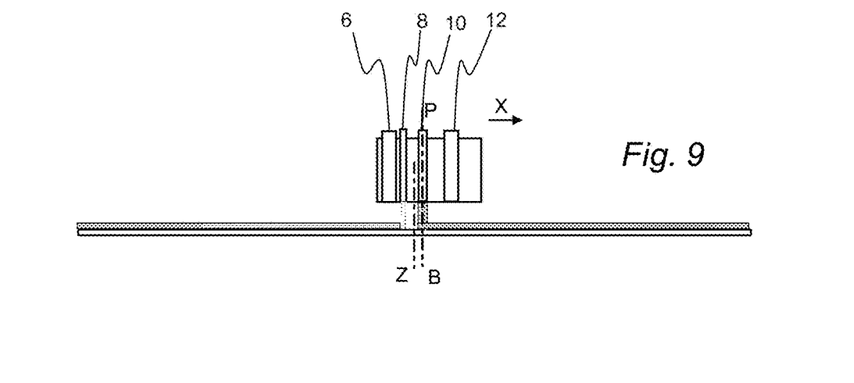
FIG. 9 shows a schematic cross-sectional view of an embodiment of the invention when the nozzle of the first gas dispenser starts the liquid removing in the center of a semiconductor wafer.

In the embodiment of FIG. 7, the nozzle assembly 4 itself is not fundamentally different than that described in the commonly-owned co-pending application US 2010/0206338; however, the nozzle assembly 4 is rigidly mounted to the rotary arm 3 at an oblique angle such that the line L8 that passes through the centers of the individual curtain nozzles 6 forms the above-described angle α with the line L7 that connects the axis s and the center of the second gas nozzle.

The position, size, shape and/or orientation of the curtain nozzles 6 in the foregoing embodiments provide a solution to the problem identified by the present inventors when the nozzle assemblies of the commonly-owned co-pending application US 2010/0206338 are used on a swing arm type of dispenser, rather than on a dispenser that moves in a straight line above the spin chuck. In particular, the present inventors found that by orienting the curtain nozzles 6 such that they are elongated along a horizontal line L8 defining an angle α with the horizontal line L7 as shown in FIGS. 2-7, the problem with incomplete drying and residual droplets could be overcome.

The angle α is preferably selected such that the curtain nozzles extend generally parallel (preferably within +/−3°) to the circumference of the wafer when the nozzle assembly reaches the edge of the wafer.

Figure 11:
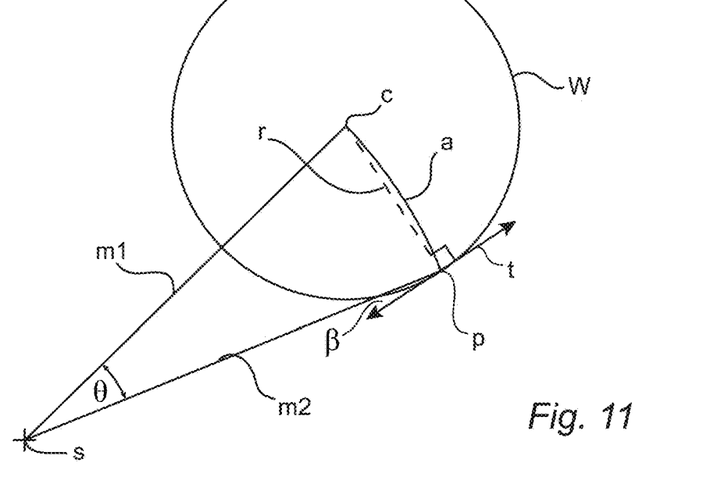
FIG. 11 is an explanatory plan view illustrating a preferred technique for selecting the angle α at which the nozzle(s) of the second gas dispenser will be inclined.

FIG. 11 illustrates a preferred technique for determining the angle α. The vertical axis s is the axis of rotation of the swing arm, and the nozzle assembly 4 is thus moved over the circular arc a from the center c of the wafer W, to a point p at or near the edge of wafer W (it will be appreciated that the full range of motion of the nozzle assembly via rotary arm 3 may be greater than the arc a, especially when the nozzle assembly commences operation from a point in advance of the center of the wafer W). The line segment m1 signifies the position of boom 7 when the nozzle assembly is above the center c of wafer W (and hence aligned with the axis of rotation of spin chuck 2), whereas the line segment m2 signifies the position of boom 7 when the nozzle assembly is above the point p that is at or near the edge of wafer W. The length of m1 is the same as that of m2.

It therefore follows that the angle shown in FIG. 11 is the angle subtended by arc a to axis s, and that the radius r is the chord of the arc a. When the length of m1, m2 is large in relation to r, the lengths of a and r can be considered to be effectively the same.

The line t is the tangent at point p to the circle described by wafer W. Tangent line t and line segment m2 therefore define an angle β whose value is /2, as that angle β is the complement of the adjacent interior angle of the isoceles triangle defined by m1, m2 and r. The angle α at which the curtain nozzle are turned relative to the line L7, is thus preferably selected to be within +/−three degrees of β, and thus in a range of /2−3° to /2+3°.

For example, in the case of a 300 mm wafer W, the radius r is 15 cm. Assume that the axes of rotation of the spin chuck and liquid dispenser are separated by 40 cm, which is therefore the length of m1 and hence also m2. The angle in that case is 22°, and the arc a has a length of 15.36 cm, which indeed closely approximates the radius of the wafer W. The angle β in that case is 11°, and therefore a is preferably selected to be an angle in the range of 8-14°, more preferably in the range of 9-13°, and most preferably 11°.

It will be appreciated that the value of, and hence of β, will vary as a function mainly of r and of m1, m2. Consider, for example, a wafer of 450 mm diameter, which corresponds to a next generation standard in semiconductor manufacturing. The value of r in that case would be 22.5 cm. If it were desired to keep the same value of 22° for, then the distance between the axes of rotation and hence of m1 and m2 would need to be increased to 58 cm. On the other hand, if it were desired to maintain the same 40 cm separation between the axes of rotation, then the angle would increase to 33°, and the value of β would then become 16.5°. It is of course also contemplated that, for a different value of r, the values of m1, m2 and could both be changed to an intermediate extent, so as to achieve the best balance therebetween.

Figure 12:
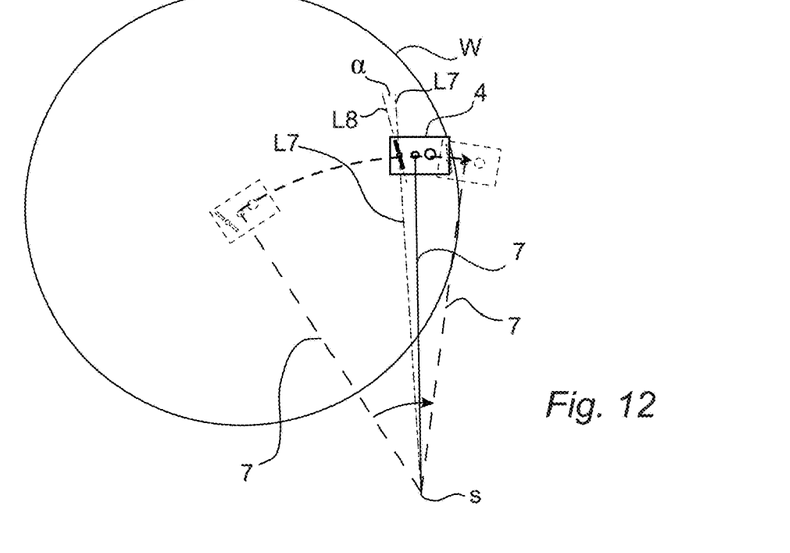
FIG. 12 is a schematic top view of an embodiment of the invention well after the nozzle of the first gas dispenser has started the liquid removing in the center of a semiconductor wafer (wafer) and is supported by the second gas dispenser.

As shown in FIG. 12, the nozzle assembly is preferably rigidly mounted to the boom arm 7 so that the direction of alignment of nozzles 8 and 10 is approximately perpendicular to the boom arm 7. Thus, as the nozzle assembly is moved past the center of the wafer W and toward the edge thereof, the orientation of the inclined curtain nozzles 6 becomes progressively more normal to the radius r, until, upon reaching the edge of the wafer W, the curtain nozzles 6 extend approximately parallel to the tangent line t. Notably, this means that the angle of the curtain nozzles to the radius r varies continuously as the nozzle assembly is moved along arc a.

Based on the first embodiment of the nozzle assembly a process for removing liquid shall be described with reference to FIG. 2 and FIGS. 8-10. Here a wafer with a diameter of 300 mm shall be dried.

Figure 14:
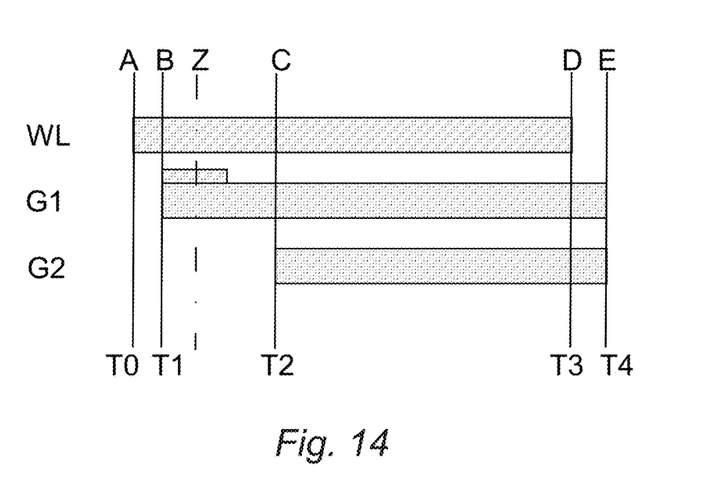
FIG. 14 is a visualization of a method in a second embodiment of the invention with respect to the position of the nozzle over the wafer.

After a cleaning process rinsing liquid is applied to the wafer surface through the rinsing nozzle 12 (at 10 l/min) while the rinsing nozzle may scan across the wafer surface. The rinsing liquid stops at the center Z (FIG. 8), whereby the wafer surface is kept thoroughly wet. At this position of the nozzle assembly 4 the center of the wetting nozzle 10 is at position A. The position A is 20 mm before the center Z with reference to the moving direction of the nozzle assembly 4. In the following the center P of the wetting nozzle 10 is used as reference position. At position A the wetting liquid (e.g. DI-water) is applied through the wetting nozzle 10 at a volume flow of 0.4 l/min. A cross-sectional area of 4 mm² results in a wetting liquid velocity of 2.5 m/s. The rinsing liquid is switched off when the wetting liquid is switched on in position A (see FIG. 8). The nozzle assembly is moved over the center Z of the rotational movement (R) across the wafer at a speed of about 5 mm/s so that the nozzle is held in a position where the opening nozzle 8 is closer to the center Z after the opening nozzle has passed the center Z. The first gas flow is switched on before the opening nozzle 8 has reached the center Z but after the wetting nozzle 10 has passed the center Z whereby the liquid layer L is initially opened around the center (see FIG. 9). The gas volume flow dispensed through the opening nozzle is f1 6 l/min (100 cm³/s). In order to further support the opening of the liquid layer f1 can be selected even higher just for a starting phase of 5 s (e.g. 10 l/min) (visualized in FIG. 14).

Figure 10:
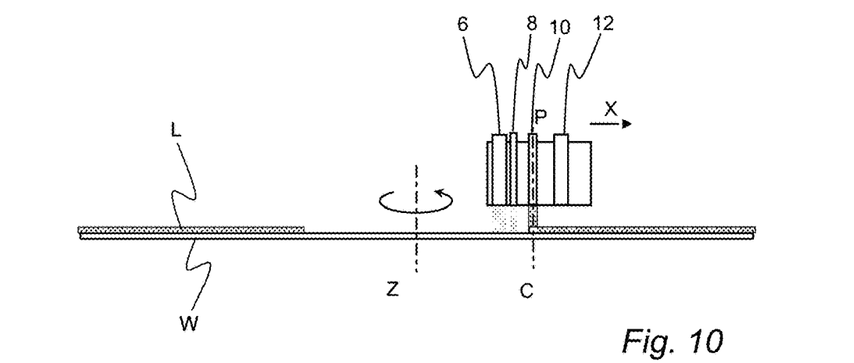
FIG. 10 is a schematic cross-sectional view of an embodiment of the invention well after the nozzle of the first gas dispenser has started the liquid removing in the center of a semiconductor wafer and is supported by the second gas dispenser.

The nozzle assembly 4 is further moved towards the wafer edge. The liquid flow of the wetting liquid and the first gas flow are kept constant and thus a smooth liquid/gas boundary layer is established, which is slowly moved towards the wafer edge with the movement of the nozzle assembly. When the center of the wetting nozzle P has a distance to the rotation center Z of 50 mm (position C), the curtain nozzle 6 is switched on, whereby a broader area of the boundary layer is supplied with gas (FIG. 10). Optionally the gas flow of the opening nozzle can be stopped or lowered. When it is lowered it can be lowered to a gas volume flow, which is a fourth of the gas volume flow of the second gas flow. Consequently the gas velocity of the first gas flow would than match with the gas velocity of the second gas flow. When the wetting nozzle reaches position D, which is 140 mm from the center Z wetting liquid is switched off (the opening nozzle then is at a distance of 130 mm from the center). When the wetting nozzle reaches position E, which is 160 mm from the center Z both gas flows are switched off (the opening nozzle then is at a distance of 150 mm from the center–the wafer's edge).

In order to further support the establishment of a smooth boundary layer a surface energy influencing medium (e.g. 2-propanol) can be entered to the system either through one of the gas flows (or both gas flows) or through the wetting liquid or through both, the wetting liquid and the gas flow(s).

Figure 13:
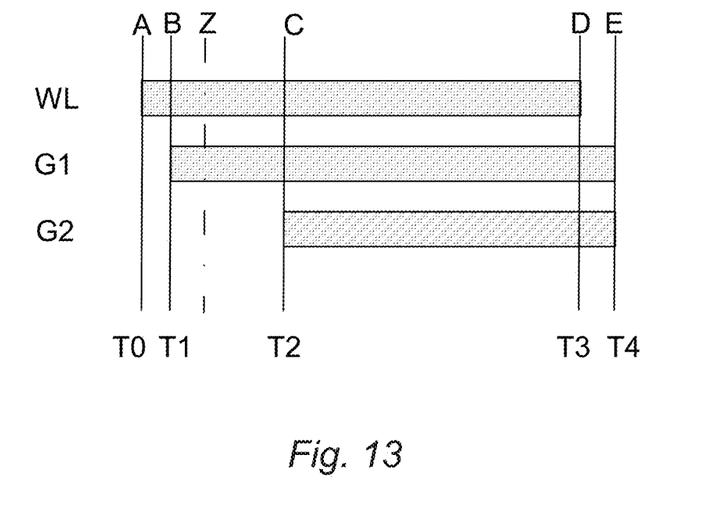
FIG. 13 is a visualization of a method in a first embodiment of the invention with respect to the position of the nozzle over the wafer, and with respect to the time of supplying liquid, first gas and second gas onto the wafer.

Table 1 and table 2 summarize the described process example, which is visualized in FIG. 13.

TABLE: 1

| Position P | Action | Distance to Center PZ = r | | |
|---|---|---|---|---|
| A | switch on wetting liquid | −20 mm | T0 | 0 s |
| B | switch on gas 1 | 5 mm | T1 | 5 s |
| C | switch on gas 2 | 50 mm | T2 | 14 s |
| D | switch off wetting liquid | 140 mm | T3 | 32 s |
| E | switch off gas 1 and 2 | 160 mm | T4 | 36 s |

TABLE 2

| | |
|---|---|
| rotation velocity w: | 300-600 rpm |
| wetting liquid volume flow: | 0.4 l/min |
| moving speed of nozzle assembly m: | 5 mm/s |
| cross sectional area of opening nozzle (3.2 mm diameter of the orifice): | 8 mm² = 0.08 cm² |
| gas volume flow f1: | 6 l/min (100 cm³/s) |
| gas velocity v1: | 12.5 m/s |
| cross sectional area of curtain nozzles together (2 × 8 mm × 2 mm): | 32 mm² = 0.32 cm² |
| gas volume flow f2: | 6 l/min (100 cm³/s) |
| gas velocity v2: | 3.13 m/s |

To further support the liquid removing process it is desirable to keep the circumferential velocity at the point of impact of the wetting liquid constant. For instance from the center until position C (in the above example ZC is 50 mm) the rotation speed is kept constant at 300 rpm. The circumferential velocity (vc(r)) at the point of impact P of the wetting liquid thus increases from 0 m/s to 2.36 m/s. Thereafter the rotational speed should be adjusted in dependency on the distance r of the position P of the center of the wetting nozzle 10 described by the following formula:

$$w(r)=w1*r1/r$$

wherein
w1 . . . is a basis rotational speed,
r1 . . . is the distance of the point of impact to the rotational center from which onward the circumferential speed shall be kept constant This means that when the wetting nozzle has a distance of 100 mm to the rotational center, the rotational speed shall be 150 rpm and at the edge (r=150 mm) the rotational speed shall be 100 rpm.

It is furthermore desirable that the moving speed m has to be decelerated the farther the nozzle moves outward. For instance the moving speed from center to position C is 12 mm/s and is lowered thereafter. E.g. at r=100 mm should be m=6 mm/s and at r=150 mm m=4 mm/s.

$$-1 \text{ cm} < d2-d1 < +1 \text{ cm preferred } d1-d2=0$$

For the above described example the surface active substance is added to the second gas flow at a concentration of 1500 ppm 2-propanol in nitrogen as a carrier gas.

Alternatively the surface active substance (2-propanol) can be added to the wetting liquid (DI-water) at a concentration of 20% per weight. In this case the moving speed m of the nozzle assembly is selected at 2 mm/s.

In an alternative example the wafer is held up-side-down on a spin chuck, which means that liquids and gas are supplied to the wafer from below. Alternatively both sides of the wafer can be dried simultaneously by using the same method e.g. with a spin chuck as disclosed in U.S. Pat. No. 6,536,454.

The invention claimed is:

1. A device for removing liquid from a surface of a disc-like article, comprising:
   a spin chuck for holding and rotating a single disc-like article about an axis of rotation;
   a liquid dispenser for dispensing liquid onto the disc-like article;
   a first gas dispenser comprising at least one nozzle with at least one orifice for blowing gas onto the disc-like article;
   a second gas dispenser comprising at least one nozzle with at least one orifice for blowing gas onto the disc-like article; and
   a rotary arm for moving the liquid dispenser and the second gas dispenser across the disc-like article along a circular arc so that the second gas dispenser and the liquid dispenser move to a point in a peripheral region of the spin chuck,
   wherein the at least one nozzle of the second gas dispenser is elongated along a first horizontal line, the first horizontal line defining an angle $\alpha$ of 8-15° relative to a second horizontal line connecting the center of the second gas dispenser and the rotation axis of the rotary arm,
   wherein an outlet orifice of the liquid dispenser and the at least one orifice of the first gas dispenser are aligned along a third horizontal line, and
   wherein the first horizontal line forms an oblique angle with the third horizontal line.

2. The device according to claim 1, wherein the angle $\alpha$ is in a range from $\theta/2-3°$ to $\theta/2+3°$, wherein $\theta$ is a range of angular movement of the rotary arm from a center of the spin chuck to a periphery of the spin chuck and $\theta$ is 16° to 34°.

3. The device according to claim 1, wherein the third horizontal line perpendicular to the second horizontal line.

4. The device according to claim 1, wherein the liquid dispenser, the first gas dispenser and the second gas dispenser are integrated into a multi-nozzle head mounted at a distal end of the rotary arm.

5. The device according to claim 1, wherein a sum of cross-sectional areas of the at least one orifice of the first gas dispenser is smaller than a sum of cross-sectional areas of the at least one orifice of the second gas dispenser.

6. The device according to claim 1, wherein the liquid dispenser and the second gas dispenser are positioned on the rotary arm so that the second gas dispenser follows the liquid dispenser as the liquid dispenser and the second gas dispenser are moved across the disc-like article.

7. The device according to claim 1, wherein the liquid dispenser and the first gas dispenser are positioned on the rotary arm so that the first gas dispenser follows the liquid dispenser as the liquid dispenser and the first gas dispenser are moved across the disc-like article.

8. The device according to claim 1, wherein the at least one orifice of the second gas dispenser is slit-shaped and elongated along the first horizontal line.

9. The device according to claim 1, wherein the at least one orifice of the second gas dispenser comprises two slit-shaped orifices, each of which is elongated along the first horizontal line.

10. The device according to claim 9, wherein the two slit-shaped orifices have centers aligned along the first horizontal line.

11. The device according to claim 1, wherein the angle $\alpha$ is 8-15°.

12. The device according to claim 1, wherein the at least one orifice of the second gas dispenser comprises two circular orifices having centers aligned along the first horizontal line.

13. The device according to claim 1, wherein the rotary arm is configured to rotate about a vertical axis parallel to and offset from the axis of rotation of the spin chuck, so as to move the second gas dispenser along an arcuate path from the axis of rotation of the spin chuck to the point, and wherein, when the second gas dispenser is positioned at the point, the first horizontal line is substantially perpendicular to the radius of a circle centered on the axis of rotation of the spin chuck that passes through the point.

14. The device according to claim 1, wherein the first horizontal line forms an angle with a radius of rotation of the spin chuck that changes continuously as the second gas dispenser is moved across the spin chuck.

15. A device for removing liquid from a surface of a disc-like article, comprising:
   a spin chuck for holding and rotating a single disc-like article about an axis of rotation;
   a liquid dispenser for dispensing liquid onto the disc-like article;
   a first gas dispenser comprising at least one nozzle with at least one orifice for blowing gas onto the disc-like article;
   a second gas dispenser comprising at least one nozzle with at least one orifice for blowing gas onto the disc-like article; and
   a rotary arm for moving the liquid dispenser and the second gas dispenser across the disc-like article along a circular arc so that the second gas dispenser and the liquid dispenser move to a point in a peripheral region of the spin chuck,
   wherein the at least one nozzle of the second gas dispenser is elongated along a first horizontal line, the first horizontal line defining an angle $\alpha$ of 8-15° relative to a second horizontal line connecting the center of the second gas dispenser and the rotation axis of the rotary arm.

* * * * *